(12) United States Patent
Venkataraman et al.

(10) Patent No.: US 7,969,219 B2
(45) Date of Patent: Jun. 28, 2011

(54) WIDE RANGE DELAY CELL

(75) Inventors: Jagannathan Venkataraman, Bangalore (IN); Vivesvaraya A. Pentakota, Bangalore (IN); Samarth S. Modi, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/623,982

(22) Filed: Nov. 23, 2009

(65) Prior Publication Data

US 2010/0148838 A1  Jun. 17, 2010

(30) Foreign Application Priority Data

Nov. 26, 2008  (IN) .............................. 2947/CHE/2008

(51) Int. Cl.
 *H03H 11/26* (2006.01)
(52) U.S. Cl. ......... 327/237; 327/232; 327/264; 327/278
(58) Field of Classification Search .......... 327/172–174, 327/232–237, 243–244, 263–264, 270, 272, 327/276, 278
See application file for complete search history.

(56) References Cited

U.S. PATENT DOCUMENTS

| | | | | |
|---|---|---|---|---|
| 5,012,141 | A * | 4/1991 | Tomisawa | 327/276 |
| 6,049,245 | A * | 4/2000 | Son et al. | 327/544 |
| 6,573,777 | B2 * | 6/2003 | Saint-Laurent et al. | 327/276 |
| 6,693,475 | B2 * | 2/2004 | Lutkemeyer | 327/161 |
| 6,897,696 | B2 * | 5/2005 | Chang | 327/175 |
| 7,084,682 | B2 * | 8/2006 | Jeon et al. | 327/158 |
| 2008/0278201 | A1 * | 11/2008 | Lee | 327/108 |

* cited by examiner

*Primary Examiner* — An T Luu
(74) *Attorney, Agent, or Firm* — John J. Patti; Wade J. Brady, III; Frederick J. Telecky, Jr.

(57) ABSTRACT

A delay cell with a wider delay range is provided. The delay cell employs frequency dependent current source to generate the majority of the delay of the cell, while a control circuit (which is generally a current source that is controlled by a control voltage) provides additional delay. Thus, the delay cell provided here can be used to improve the performance of delay locked loops (DLLs) and other circuits.

6 Claims, 2 Drawing Sheets

WIDE RANGE DELAY CELL

CROSS-REFERENCE TO RELATED APPLICATIONS

This application claims priority from Indian Provisional Application No. 2947/CHE2008, filed Nov. 26, 2008, which is hereby incorporated by reference for all purposes.

TECHNICAL FIELD

The invention relates generally to a delay cell and, more particularly, to a delay cell for having a wide delay range.

BACKGROUND

Delay cells are generally employed in delay locked loops (DLLs) and duty cycle corrector (DCC) circuits. In operation, a control voltage can be applied to the delay cell to vary the length of the delay through the cell. Some examples of conventional delay cells can be seen in FIGS. 1 and 2.

Turning to FIG. 1 of the drawings, the reference numeral 100 generally designates a conventional load based delay cell. The delay cell 100 is generally comprised of PMOS transistor Q1, NMOS transistors Q2 and Q3, capacitor-connected NMOS transistor Q4, and capacitor C1. Capacitor-connected NMOS transistor Q4 and capacitor C1 have capacitances of bout 0.6 pF and 12 fF, respectively. Transistors Q1 and Q2 are configured as an inverter with transistor Q3 coupled to the output terminal of the inverter. A control voltage CNTL can be applied to the gate of transistor Q3 so that the delay of cell 100 can be varied.

Turning to FIG. 2 of the drawings, the reference numeral 200 generally designated a conventional current starved delay cell. Delay cell 200 replaces transistors Q3 and Q4 of cell 100 with transistors Q5 and Q6 (which are NMOS transistors coupled in series between the source of transistor Q2 and supply rail VSS. With cell 200, a control voltage CNTL is applied to the gates of transistors Q5 and Q6 so that the delay of cell 200.

A typical application for cells 100 and 200 may specify support for more than 10× variation in clock frequencies. To support such a wide locking range, the delay cell 100 or 200 would generally support wide delay ranges. Cells 100 and 200, though, do not have such a wide delay range. Several different solutions exist that employ these cells, but each of those designs have drawbacks.

SUMMARY

A preferred embodiment of the present invention, accordingly, provides an apparatus. The apparatus comprises a first supply rail; a second supply rail; an inverter having an input terminal and an output terminal, wherein the input terminal of the inverter receives an input signal having a frequency; a first variable current source that is coupled between the first supply rail and the inverter, wherein the first variable current source provides a first current that is generally proportional to frequency of the input signal; a second variable current source that is coupled between the second supply rail and the inverter, wherein the second variable current source provides a second current that is generally proportional to frequency of the input signal; a control circuit that is coupled in parallel to the second variable current source, wherein the control circuit receives a control voltage.

In accordance with a preferred embodiment of the present invention, the control circuit further comprises a first NMOS transistor that is coupled to the inverter at its drain and that receives the control voltage at its gate; and a second NMOS transistor that is coupled to the second supply rail at its source, that is coupled to the source of the first NMOS transistor at its drain, and that receives the control voltage at its gate.

In accordance with a preferred embodiment of the present invention, the apparatus further comprises a capacitor coupled between the output terminal of the inverter and the second supply rail.

In accordance with a preferred embodiment of the present invention, an apparatus is provided. The apparatus comprises a phase detector (PD) that receives a reference signal; a charge pump that is coupled to the PD; a loop filter that is coupled to the charge pump and that generates a control voltage; a delay line having a set of delay cells coupled in series with one another, wherein the first delay cell of the set receives the reference signal, and wherein the last delay cell of the set is coupled to the PD, wherein each delay cell includes: an input terminal that receives an input signal having a frequency; an output terminal; a first supply rail; a second supply rail; a PMOS transistor that is coupled to the input terminal at its gate and that is coupled to the output terminal at its drain; a first NMOS transistor that is coupled to the input terminal at its gate and that is coupled to the output terminal at its drain; a first variable current source that is coupled between the first supply rail and the source of the PMOS transistor, wherein the first variable current source provides a first current that is generally proportional to frequency of the input signal; a second variable current source coupled between the second supply rail and the source of the first NMOS transistor, wherein the second variable current source provides a second current that is generally proportional to frequency of the input signal; a second NMOS transistor that is coupled to the source of the first NMOS transistor at its drain and that receives the control voltage at its gate; and a second NMOS transistor that is coupled to the second supply rail at its source, that is coupled to the source of the first NMOS transistor at its drain, and that receives the control voltage at its gate.

In accordance with a preferred embodiment of the present invention, each delay cell further comprises a capacitor coupled between the output terminal and the second supply rail.

In accordance with a preferred embodiment of the present invention, the capacitance of the capacitor is about 13 fF.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
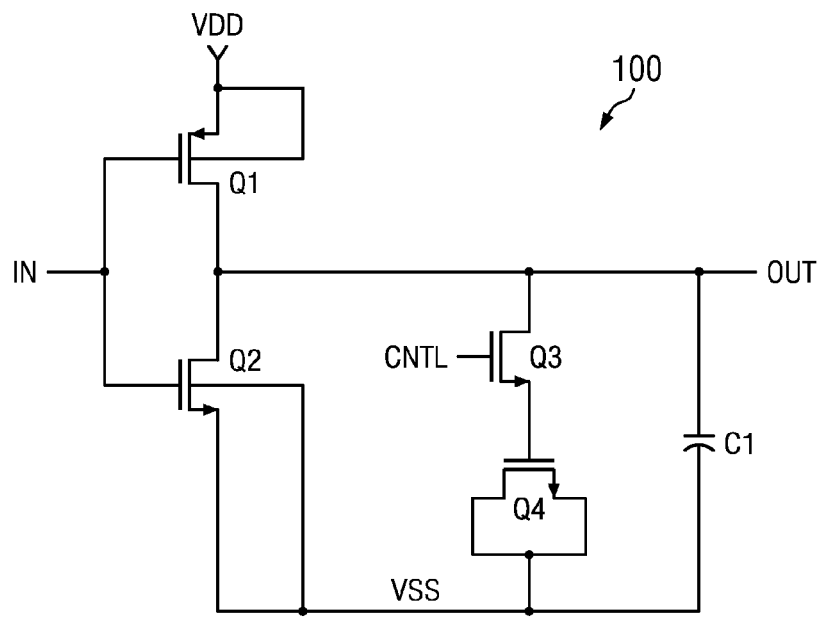
FIG. 1 is a circuit diagram of an example of a conventional load based delay cell.
Figure 2:
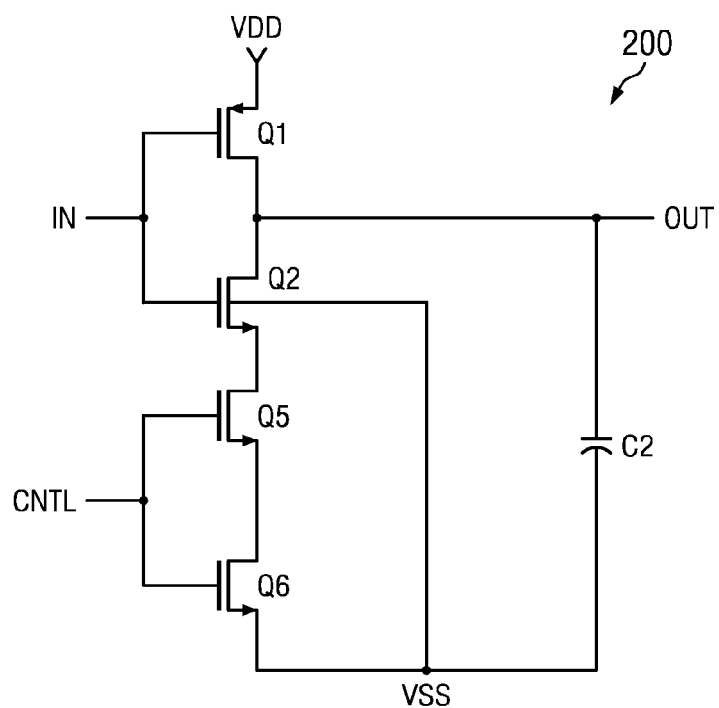
FIG. 2 is a circuit diagram of an example of a conventional current starved delay cell.

Refer now to the drawings wherein depicted elements are, for the sake of clarity, not necessarily shown to scale and wherein like or similar elements are designated by the same reference numeral through the several views.

Figure 3:
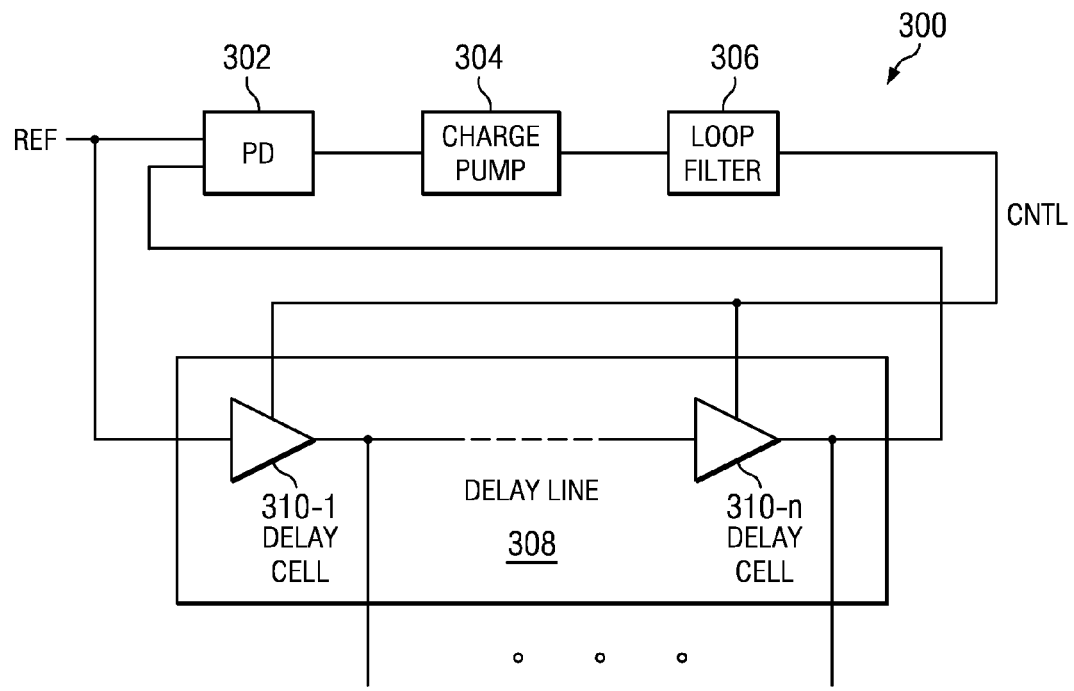
FIG. 3 is an example of a DLL in accordance with a preferred embodiment of the present invention.

Referring to FIG. 3 of the drawings, the reference numeral 300 generally designates an example of a DLL in accordance with a preferred embodiment of the present invention. DLL 300 generally comprises a phase detector (PD) 302, a charge pump 304, a loop filter 306, and a delay line 308. In operation, the PD 302 compares an output from the delay line 308 to a reference signal REF. Based on the comparison, PD 302 provides control to charge pump 304, which with the loop filter 306, generates a control voltage CNTL for delay cells 310-1 to 310-*n* of delay line 308. Other similar circuits, such as DCC circuits, may also use delay cells 310-1 to 310-*n*.

Figure 4:
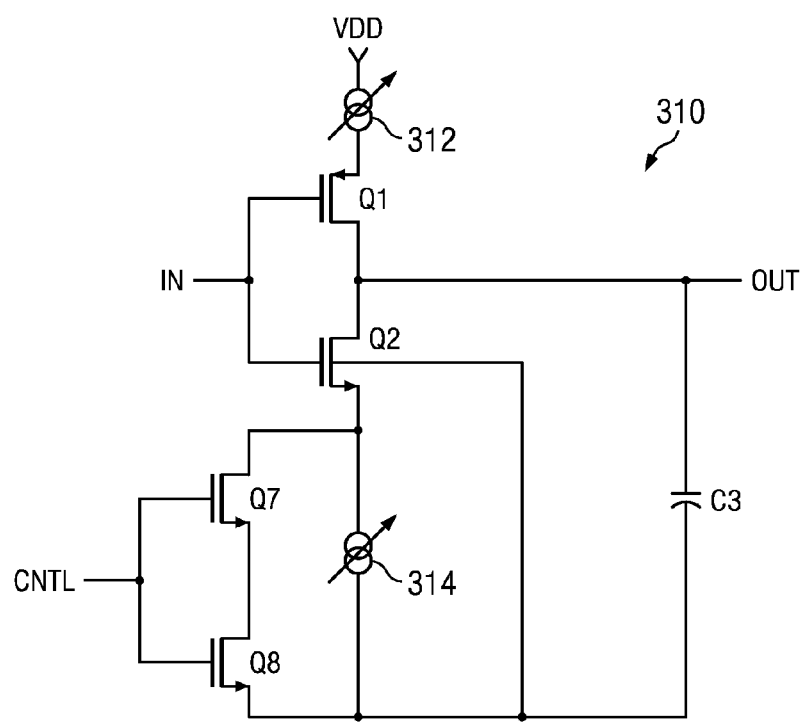
FIG. 4 is an example of a delay cell in accordance with a preferred embodiment of the present invention, which is used in the DLL of FIG. 3.

Looking specifically to the delay cells 310-1 to 310-*n* (which are referred to hereafter as 310), FIG. 4 shows an example of a circuit diagram for the delay cell 310. As with delay cells 100 and 200, transistors Q1 and Q2 are configured as an inverter. A difference between cell 300 and cells 100 and 200, are the use of variable current sources 312 and 314, which are coupled between the inverter and supply rails VDD and VSS, respectively. A control circuit (which is generally comprised of NMOS transistors Q7 and Q8) is also generally coupled in parallel to current source 314. A control voltage CNTL (i.e., from loop filter 306) can be applied to the gates of transistors Q7 and Q8, so as to vary the delay of cell 302. Additionally, capacitor C3 (generally having a capacitance of about 13 fF) is coupled between the output terminal and supply rail VSS.

Cell 300 is generally, a current starved delay cell, which can provide wider delay ranges compared to cells 100 and 200. In a typical current starved cell (i.e., cell 200), the delay range is provided by the current sources (i.e., transistors Q4 and Q5) controlled by the control voltage CNTL, which does not provide a sufficient delay range for a typical supportable control voltage swings of 1V on a 1.8V supply and which also may not be linear for such a wide range of control voltages. In contrast to cell 200, cell 300 includes current source 314, which is provided in parallel with control circuit (transistors Q7 and Q8) and which scales with the clock frequency. For larger clock frequencies, the inverter is stronger and provides smaller delay. For smaller clock frequencies, the inverter becomes weaker and the delay of the cell is increased. Thus, the majority of the delay range control is provided by this frequency dependent current source 314, while control circuit (transistors Q7 and Q8) provides further delay range for the full control voltage swing. Therefore, delay cell 300 provides very wide delay range compared to conventional delay cells (i.e., cell 200). Additionally, the frequency scalable bias current for current sources 312 and 314 is generated by a conventional switched capacitor circuit.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a first supply rail;
a second supply rail;
an inverter having an input terminal and an output terminal, wherein the input terminal of the inverter receives an input signal having a frequency;
a first variable current source that is coupled between the first supply rail and the inverter, wherein the first variable current source provides a first current that is generally proportional to the frequency of the input signal;
a second variable current source that is coupled between the second supply rail and the inverter, wherein the second variable current source provides a second current that is generally proportional to the frequency of the input signal;
a control circuit that is coupled in parallel to the second variable current source, wherein the control circuit receives a control voltage.

2. The apparatus of claim 1, wherein the control circuit further comprises:
a first NMOS transistor that is coupled to the inverter at its drain and that receives the control voltage at its gate; and
a second NMOS transistor that is coupled to the second supply rail at its source, that is coupled to the source of the first NMOS transistor at its drain, and that receives the control voltage at its gate.

3. The apparatus of claim 1, wherein the apparatus further comprises a capacitor coupled between the output terminal of the inverter and the second supply rail.

4. An apparatus comprising:
a phase detector (PD) that receives a reference signal;
a charge pump that is coupled to the PD;
a loop filter that is coupled to the charge pump and that generates a control voltage;
a delay line having a set of delay cells coupled in series with one another, wherein the first delay cell of the set receives the reference signal, and wherein the last delay cell of the set is coupled to the PD, wherein each delay cell includes:
an input terminal that receives an input signal having a frequency;
an output terminal;
a first supply rail;
a second supply rail;
a PMOS transistor that is coupled to the input terminal at its gate and that is coupled to the output terminal at its drain;
a first NMOS transistor that is coupled to the input terminal at its gate and that is coupled to the output terminal at its drain;
a first variable current source that is coupled between the first supply rail and the source of the PMOS transistor, wherein the first variable current source provides a first current that is generally proportional to the frequency of the input signal;
a second variable current source coupled between the second supply rail and the source of the first NMOS transistor, wherein the second variable current source provides a second current that is generally proportional to the frequency of the input signal;
a second NMOS transistor that is coupled to the source of the first NMOS transistor at its drain and that receives the control voltage at its gate; and
a third NMOS transistor that is coupled to the second supply rail at its source, that is coupled to the source of the first second NMOS transistor at its drain, and that receives the control voltage at its gate.

5. The apparatus of claim 4, wherein each delay cell further comprises a capacitor coupled between the output terminal and the second supply rail.

6. The apparatus of claim 5, wherein the capacitance of the capacitor is about 13 fF.

* * * * *